US011521692B2

(12) United States Patent
Choy et al.

(10) Patent No.: US 11,521,692 B2
(45) Date of Patent: Dec. 6, 2022

(54) MEMORY WITH ONE-TIME PROGRAMMABLE (OTP) CELLS AND READING OPERATIONS THEREOF

(71) Applicant: NXP USA, Inc., Austin, TX (US)

(72) Inventors: Jon Scott Choy, Austin, TX (US); Jacob T. Williams, Austin, TX (US); Karthik Ramanan, Austin, TX (US); Padmaraj Sanjeevarao, Austin, TX (US); Maurits Mario Nicolaas Storms, Best (NL)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 17/249,906

(22) Filed: Mar. 18, 2021

(65) Prior Publication Data

US 2022/0301647 A1    Sep. 22, 2022

(51) Int. Cl.
G11C 17/18    (2006.01)
G11C 17/16    (2006.01)
(Continued)

(52) U.S. Cl.
CPC .......... *G11C 17/18* (2013.01); *G11C 11/1659* (2013.01); *G11C 11/1673* (2013.01);
(Continued)

(58) Field of Classification Search
None
See application file for complete search history.

(56) References Cited

U.S. PATENT DOCUMENTS 8,116,122 B2    2/2012  Li et al.
9,245,610 B2    1/2016  Kim et al.
(Continued)

FOREIGN PATENT DOCUMENTS

EP    3496102 A1    6/2019
EP    3278340 B1   12/2020

OTHER PUBLICATIONS

Jan et al.: "Demonstration of an MgO Based Anti-Fuse OTP Design Integrated With a Fully Functional STT-MRAM at the Mbit Level", 2015 Symposium on VLSI Technology Digest of Technical Papers, pp. T164-T165.
(Continued)

*Primary Examiner* — J. H. Hur

(57) ABSTRACT

A memory includes a plurality of one-time programmable (OTP) memory cells, wherein each OTP memory cell includes a corresponding storage element capable of being in a permanently blown state or non-blown state. In the non-blown state, the corresponding storage element is capable of being in a low conductive state (LCS) or high conductive state (HCS). Control circuitry is configured to, in response to a received read request having a corresponding access address which selects a set of OTP memory cells, direct write circuitry to apply a voltage differential across the corresponding storage element of each selected OTP memory cell sufficient to set the corresponding storage element to a predetermined one of the LCS or HCS, and, after the write circuitry applies the voltage differential across the corresponding storage element, direct read circuitry to read the selected OTP memory cells to output read data stored in the selected OTP memory cells.

20 Claims, 7 Drawing Sheets

(51) Int. Cl.
*G11C 11/16* (2006.01)
*G11C 11/22* (2006.01)
*G11C 13/00* (2006.01)

(52) U.S. Cl.
CPC .......... *G11C 11/1675* (2013.01); *G11C 17/16* (2013.01); *G11C 11/22* (2013.01); *G11C 13/0004* (2013.01)

(56) References Cited

U.S. PATENT DOCUMENTS

| | | |
|---|---|---|
| 9,614,144 B1 | 4/2017 | Annunziata et al. |
| 9,679,663 B2 | 6/2017 | Kim et al. |
| 9,805,816 B2 | 10/2017 | Jan et al. |
| 10,699,764 B1 | 6/2020 | Roy et al. |
| 10,861,524 B1 | 12/2020 | Roy et al. |
| 2015/0103586 A1 | 4/2015 | Kim et al. |
| 2021/0398579 A1* | 12/2021 | Lee ...................... H01L 27/228 |

OTHER PUBLICATIONS

Kilopass, "SoC for IoT: Antifuse NVM for Security and Low Power", Mar. 2015, pp. 1-25.

* cited by examiner

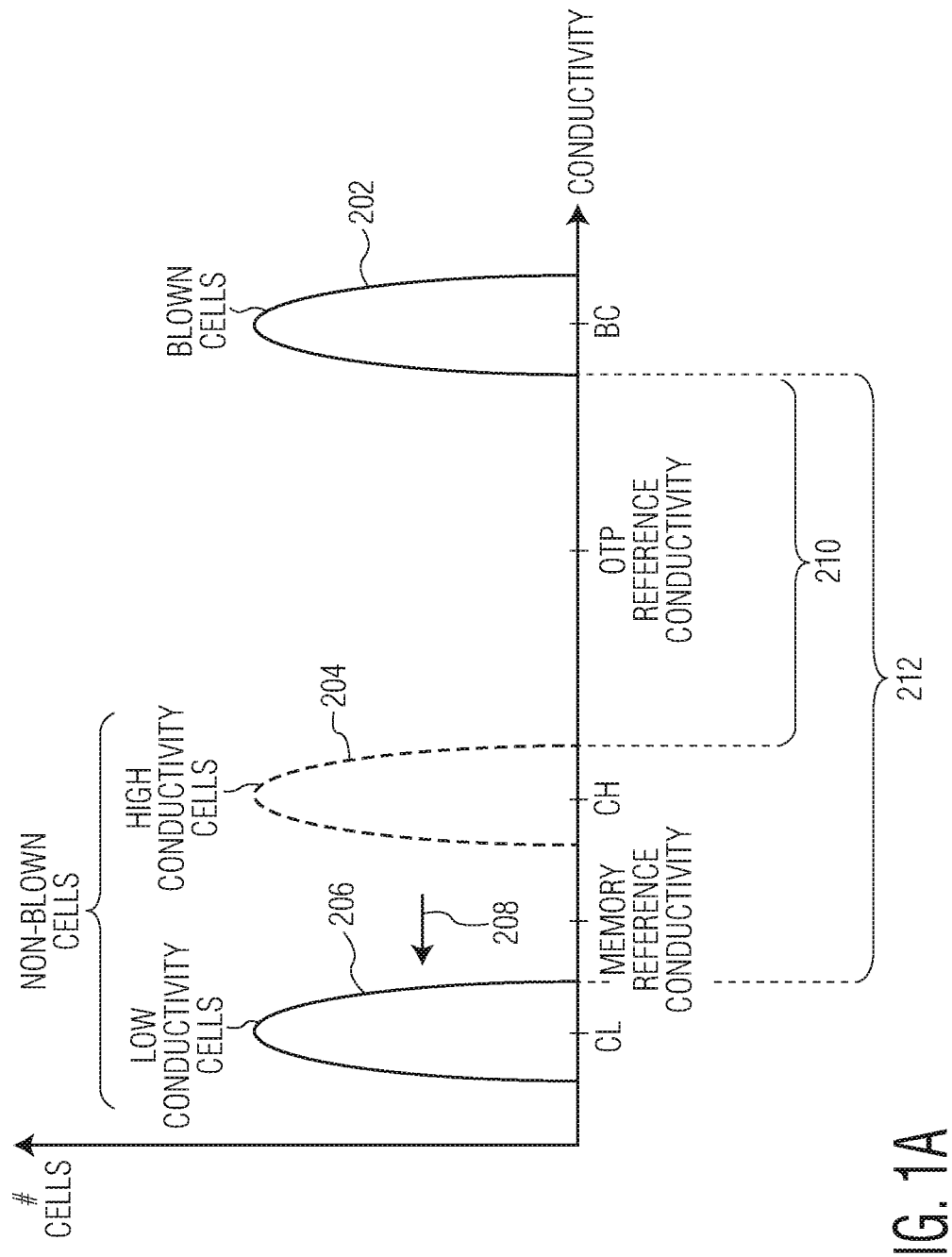

MEMORY WITH ONE-TIME PROGRAMMABLE (OTP) CELLS AND READING OPERATIONS THEREOF

BACKGROUND OF THE INVENTION

Field of the Invention

This invention relates in general to a memory and more specifically to a memory with one time programmable (OTP) cells.

Background

In general, OTP devices can be blown or permanently written to a predetermined logic state. Once blown, they cannot be overwritten to a different logic state. For example, such OTP devices may include fuses or anti-fuses. On the other hand, reprogrammable devices (i.e. non-OTP devices) can be temporarily written to a logic state. The values stored in the reprogrammable devices are temporarily stored in that they can be overwritten with a different logic state.

BRIEF DESCRIPTION OF THE DRAWINGS

The present invention may be better understood, and its numerous objects, features, and advantages made apparent to those skilled in the art by referencing the accompanying drawings.

FIGS. 1A and 1B are graphs showing distributions of conductivity of cells of a memory according to embodiments of the present invention.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

As disclosed herein, a memory includes memory cells that can be utilized as one-time programmable (OTP) devices. A memory is arranged in rows (along word lines) and columns (along bit line/source line pairs), in which the intersection of each row (word line) and column (bit line/source line pair) has a corresponding memory cell having a storage element. Each storage element is capable of storing a logic state. In one embodiment, all the cells of a memory are configured as OTP devices. In some embodiments, the memory may include both OTP devices as well as reprogrammable memory cells (in which reprogrammable memory cells can be written multiple times over the life of the memory). The storage elements of the cells which are used as OTP devices may be "blown" during an OTP write in order to provide a permanent conductive state which is determinable from the conductive state of an unblown cell (i.e. non-blown cell). In this manner, permanent values can be stored in the memory which can later be read. Each OTP device which is not blown during the OTP write can either be in a high conductive state (HCS) or a low conductive state (LCS). Memories whose cells can either be in the LCS or HCS may include, for example, magneto-resistive random access memories (MRAMs), Resistive random access memories (ReRAMs), phase changing memories (PCM), ferroelectric random access memories (FeRAMs), electric fuse or anti-fuse type memories, or the like.

In one embodiment, each time a read is performed from OTP cells of the memory, a blind write is first performed as part of the read operation in order to program all non-blown cells being read to a predetermined one of the LCS or HCS prior to completing the read operation. This increases the read window for an OTP read, which may allow for the use of smaller sense amplifiers and fewer precision references.

Figure 1B:
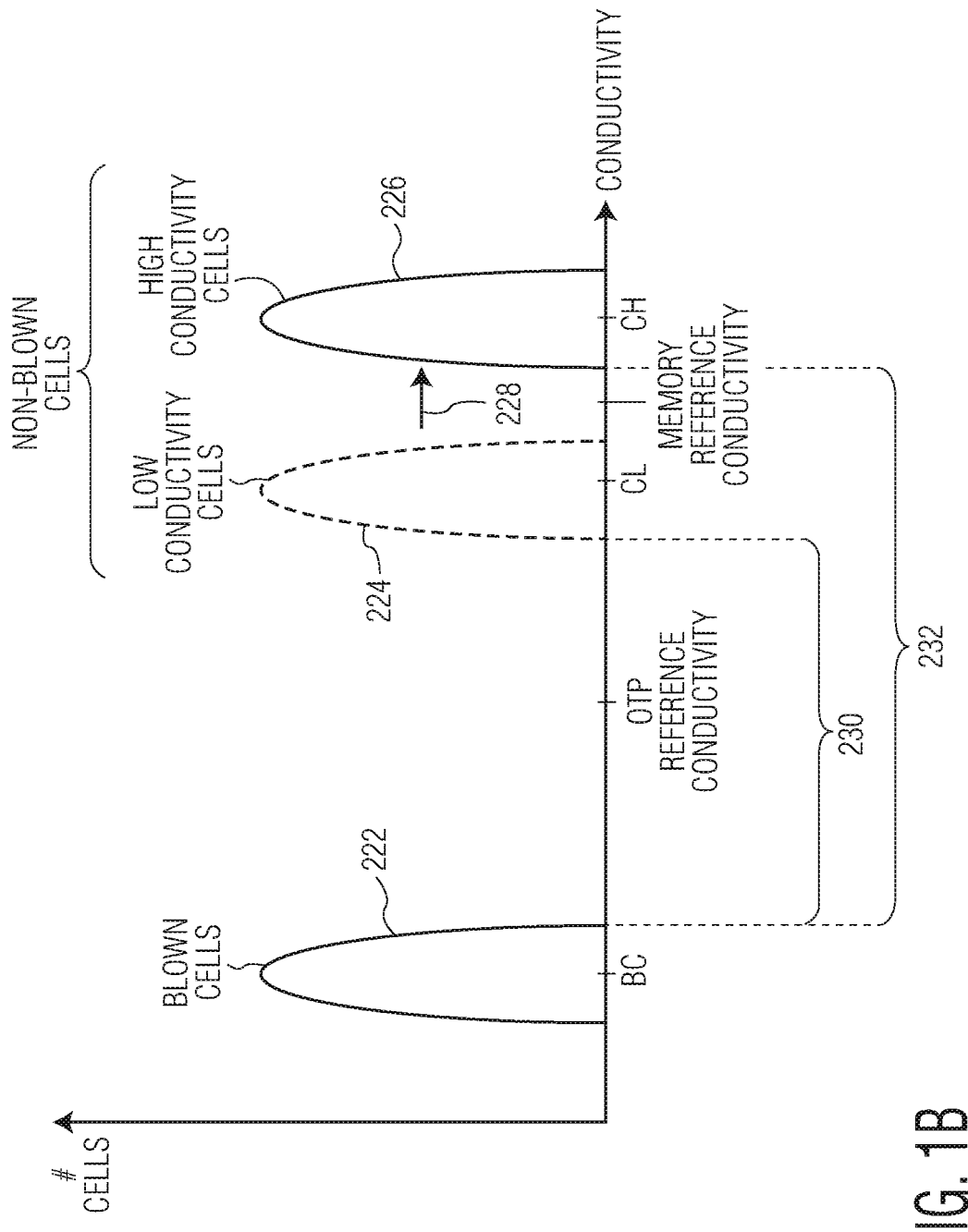

FIGS. 1A and 1B are graphs, each showing a distribution of conductivity of cells of a memory array according to one embodiment of the present invention. In FIGS. 1A and 1B, the conductivity values are on the X axis and the number of cells having a particular conductivity are on the Y axis. FIGS. 1A and 1B show the conductivity distribution for cells of an array that are blown and those that are not blown. The cells that are not blown are either in a LCS or a HCS.

In FIG. 1A, the blown cells have a conductivity distribution 202 centered on the conductivity value BC. The high conductivity cells have a conductivity distribution 204 centered on resistance CH, and the low conductivity cells have a conductivity distribution 206 centered on CL. The OTP reference conductivity can be centered half way between BC and CH. The reprogrammable conductivity resistance (i.e. the memory reference conductivity) can be centered half way between CL and CH.

Therefore, if the cells of the memory array were reprogrammable memory cells, then, during a read operation, sense amplifiers would determine whether the conductivity of a particular cell is higher or lower than the reprogrammable reference conductivity (in which a higher conductivity may correspond to a logic level zero and a lower conductivity to a logic level one, or vice versa). However, if the cells of the array are all OTP cells, during a read operation, cells with a conductivity greater than the OTP reference conductivity correspond to blown cells and provide a read output value of a first logic state (e.g. 0) while cells with a conductivity less than the OTP reference conductivity correspond to non-blown cells (which can be in either the LCS or HCS) and provide a read output value of a second logic state (e.g. 1). In this case, the sense amplifiers of read circuitry may be provided with a voltage reference which corresponds to the OTP reference conductivity.

In this example, the read window of an OTP cell is provided by window 210, which is the difference between distribution 202 and distribution 204 (the higher conductivity cells of the non-blown cells). The OTP reference conductivity should therefore be centered within window 210, such as half way between CH and BC (e.g. (CH+BC)/2). However, if it were known that all non-blown cells in a memory array were in the LCS (rather than being in either the LCS or HCS), the distribution of non-blown cells would be represented just by distribution 206. In this case, the read window of an OTP cell is expanded to the difference between distribution 202 and distribution 206, represented by window 212. Window 212 being wider than window 210 allows for a less precise reference generator during reads of the OTP memory. Even with a less precise reference, there is a larger margin (between the OTP reference and distribution 206) in which to determine whether or not a cell has a larger conductivity than the OTP reference conductivity.

In the example of FIG. 1A, the permanent state of blown cells has a conductivity that is much higher than the conductivity of the HCS. Therefore, if it is known that all non-blown cells are in the LCS (rather than being in either the LCS or HCS), the distribution of non-blown cells would be represented just by distribution 206. In the example of FIG. 1B, the permanent state of blown cells has a conductivity that is instead much lower than the conductivity of the LCS. In this case, if it is known that all non-blown cells are in the HCS (rather than being in either the LCS or HCS), the distribution of non-blown cells would be represented just by distribution 226. This would also result in a wider read window of an OTP cell (that is, the read window for the example of FIG. 1B is expanded to the difference between distribution 222 and distribution 226, represented by window 232, rather than window 230 which would be the case if the non-blown cells were in either the HCS or LCS state). Similarly, window 232 being wider than window 230 allows for a less precise reference generator during reads of the OTP memory.

Therefore, in one embodiment, as part of any read operation from the memory array 102, a blind write is first performed which results in programming all non-blown cells being read to a predetermined one of the LCS or HCS prior to sensing the cells to complete the read operation. For OTP memories (e.g. resistive memories, anti-fuse type memories) whose blown state is as illustrated in FIG. 1A (having a conductivity greater than the HCS), the predetermined one of the LCS or HCS for the blind write is the LCS, such that, for the address location being read, distribution 204 shifts (as indicated by arrow 208) into distribution 206 in which all non-blown cells being read are in the LCS and fall within distribution 206. For OTP memories (e.g. fuse-type memories) whose blown state is as illustrated in FIG. 1B (having a conductivity less than the LCS), the predetermined one of the LCS or HCS for the blind write is the HCS, such that, for the address location being read, distribution 224 shifts (as indicated by arrow 228) into distribution 226 in which all non-blown cells being read are in the HCS and fall within distribution 26. By performing a blind write as part of every read operation to ensure non-blown cells are in a predetermined one of the LCS or HCS, for the read data stored at the access address, only a distribution of the predetermined one of the LCS or HCS would be present (e.g. 206, 226) without a distribution of cells that are in the other of the LCS or HCS (e.g. 204, 224), resulting in a wider read window (e.g. 212, 232).

In the embodiments illustrated in FIGS. 2-6, it will be assumed that the memory having OTP cells is an MRAM (whose distributions are characterized by FIG. 1A). Therefore, as disclosed herein, an MRAM includes an array of MRAM cells that can be utilized as one-time programmable (OTP) devices, in which the storage element of each memory cell is implemented as a magnetic tunnel junctions (MTJ). The MRAM is arranged in rows (along word lines) and columns (along bit line/source line pairs), in which the intersection of each row (word line) and column (bit line/source line pair) has a corresponding MRAM cell having a select transistor and a magnetic tunnel junction (MTJ). In one embodiment, all the cells of an MRAM are configured as OTP devices. In some embodiments, the MRAM may include both OTP devices as well as reprogrammable MRAM cells (in which reprogrammable MRAM cells can be written multiple times over the life of the memory). The MTJs of the cells which are used as OTP devices may be "blown" during an OTP write in order to provide a permanent resistance which is determinable from the resistance of an unblown cell (i.e. non-blown cell), regardless of the magnetic state of the cell. In this manner, permanent values can be stored in the MRAM which can later be read. Each OTP device which is not blown during the OTP write can either be in a high resistive state (HRS) or a low resistive state (LRS), as determined by the direction of magnetization of the free layer of the MTJ.

Note that the HRS in the MRAM corresponds to the LCS while the LRS in the MRAM corresponds to the HCS. Similarly, the blown state of an MRAM cell has a relatively low resistance value (corresponding to a relatively high conductivity value) as compared to the non-blown state, regardless of whether the non-blown cell is in the HRS (corresponding to the LCS) or the LRS (corresponding to the HCS). In one embodiment, as will be described in more detail below, each time a read is performed from OTP cells of the MRAM, a blind write is first performed as part of the read operation in order to program all non-blown cells being read to the HRS prior to completing the read operation. This increases the read window for an OTP read.

Figure 2:
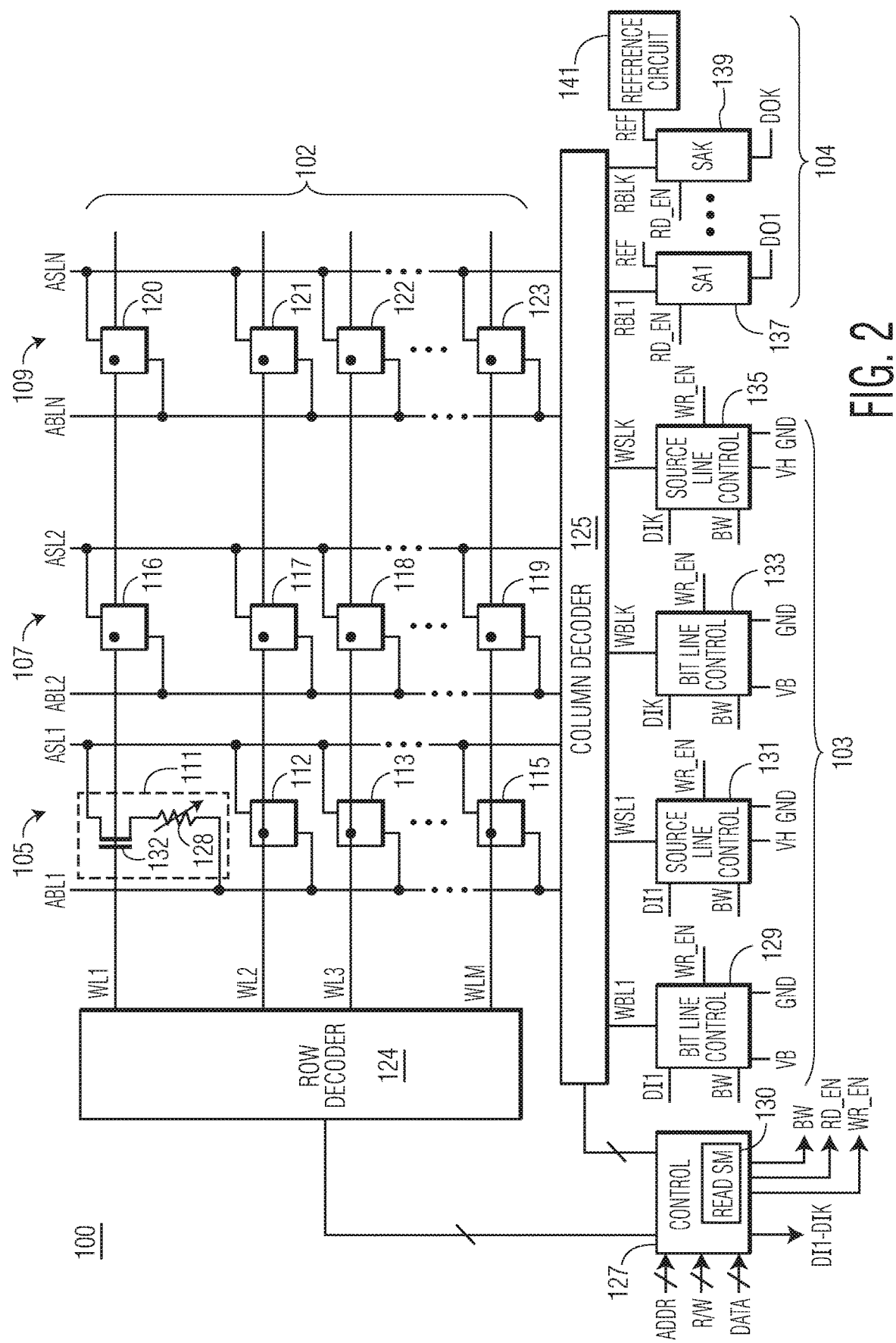
FIG. 2. is a diagram of an MRAM according to one embodiment of the present invention.

FIG. 2 is a diagram of an MRAM according to one embodiment of the present invention. Memory 100 includes an array 102 of MRAM cells (111-123) located in M rows and N columns (105, 107, 109) for storing data, in which each of M and N can be any positive integer greater than one. In the illustrated embodiments herein, it is assumed that all cells of array 102 are configured as OTP cells (i.e. OTP devices), therefore memory 100 may be referred to as an OTP memory. However, in an alternate embodiment, array 102 may be a portion of a larger memory array which also includes reprogrammable (i.e. non-OTP) MRAM cells. In this alternate embodiment, note that more circuitry may be needed in memory 100 than those elements illustrated in FIG. 2. MRAM 100 also includes a control circuit 127 which receives read and write access requests for MRAM 100. Each access request includes a corresponding access address (ADDR) which identifies (i.e. addresses) a selected set of MRAM cells for the access request, a corresponding read/write indicator (R/W) which indicates whether the access request is a read or a write request, and corresponding write data (DATA) if the access request is a write request. Control circuit 127 also includes a read state machine 130 (which may also be referred to as a read operation controller).

Still referring to FIG. 2, column 105 includes cells 111-114, column 107 includes cells 116-119, and column 109 includes cells 120-123. In one embodiment, each cell (111) is characterized as an MRAM cell that includes a magnetic tunnel junction (MTJ) (128 for cell 111) and a select transistor (132 for cell 111) whose control terminal is coupled to a word line (WL1 for cell 111) that is asserted to access a specific row of memory cells for either reads or writes to the cells. The word lines (WL1-WLM) are provided by an address row decoder 124 and are selectively activated (i.e. asserted) based on the memory address of an access request received by control 127 from processing circuitry (not shown).

Each MRAM cell of a column is connected to a corresponding array bit line of the column (one of ABL1-ABLN) and a corresponding array source line of the column (a corresponding one of ASL1-ASLN). In the illustrated embodiment, the MRAM cell is connected to the array source line at the source of the select transistor. For example, MRAM cell 111 is connected to ABL1 of column 105, and the corresponding ASL1 of column 105, in which ASL1 is connected at the source of select transistor 132. Although FIG. 2 shows that array 102 includes four rows (corresponding to word lines WL1-WLM) and three columns (105, 107, and 109), other embodiments may include a different number of rows (M) and/or a different number of columns (N).

In some embodiments, the MTJs of the cells 111-123 of MRAM array 102 have the same structure. As used herein, MTJs having the same structure mean that the corresponding structures of the MTJs have the same physical dimensions and are made of the same materials within manufacturing tolerances. Note that although a one-transistor one-resistor (1T1R or 1T1MTJ) is illustrated in FIG. 2, the cells can have a different configuration, such as a one-transistor two-resistor (1T2R) configuration. As used herein with respect to information stored in a memory, the term "data" also includes instructions or commands stored in a memory.

Memory 100 includes read circuitry 106 for reading data stored in the cells of array 102. In the embodiment shown, read circuitry 106 includes sense amplifiers (SAs) 137 and 139, each for sensing the data value stored in a memory cell by comparing the resistance of the memory cell to a reference resistance. During a read operation, a sense amplifier (e.g. SA1 137) is coupled to a corresponding bit line (e.g. ABL1) of a selected column (e.g. 105) by column decoder 125 to compare a resistance of a selected cell (e.g. 111) of that column to the reference resistance. (Alternatively, the sense amplifiers can each be coupled to a corresponding source line instead of a corresponding bit line.) Each sense amplifier also receives a read enable signal (RD_EN) from control circuit 127 which is asserted to enable the sensing of the data values stored in a selected set of MRAM cells indicated by a received read access address. The sense amplifiers SA1-SAK output the read data (DO1-DOK) to processing circuitry (not shown) on a data bus (not shown). A reference signal, REF, indicative of the reference resistance is provided to the sense amplifiers by a reference circuit 141.

Note that in alternate embodiments in which other types of memories are used, such as ReRAM, PCM, FeRAM, fuse or anti-fuse type memories, etc., the reference signal, REF, may instead be indicative of the reference conductivity. The sense amplifiers may be coupled to the bit lines or source lines, as needed, to sense voltage or current, as needed, to determine the conductivity of a selected cell for comparison with the reference conductivity.

Memory 100 includes write circuitry 103 for writing data to memory cells of array 102. In the embodiment shown, write circuitry 103 includes bit line control circuits (e.g. 129 and 133) for controlling the voltage of the array bit lines (ABL1, ABLN) of selected columns during a memory write operation to selected MRAM cells of the array. The write circuitry also includes source line control circuits (e.g. 131 and 135) for controlling the voltage of the array source lines (ASL1, ASLN) of selected columns during a memory write operation to the selected MRAM cells.

During reads and writes, control circuit 127 provides a first portion of ADDR to row decoder 124 and a second portion of ADDR to column decoder 125. During a memory access operation (read or write), row decoder 124 activates a selected word line based on the received first portion of ADDR. Row decoder 124 may activate the selected word line by setting the selected word line to a voltage that is greater than ground.

During a memory access operation, column decoder 125 couples a selected subset of K columns of array 102, based on the second portion of ADDR, to read circuitry 104 or write circuitry 103. For example, during a memory write operation, column decoder 125 couples the K array bits lines of the K selected columns to the corresponding bit line control circuits (e.g. 129 and 133) via write bit lines (WBL1-WBLK) and the corresponding K array source lines of the K selected columns to the corresponding source line control circuits (e.g. 131 and 135) via write source lines (WSL1-WSLK). During a memory read operation, column decoder 125 couples the K array bit lines of the K selected columns to sense amplifiers SA1-SAK via read bit lines (RBL1-RBLK). In an alternate embodiment, the source lines of the K selected columns, instead of the bit lines, may be coupled to the sense amplifiers via read source lines. During the memory read operation, as will be discussed further below, column decoder 125 also couples the K array bit lines of the K selected columns to the corresponding bit line control circuits, and the K array source lines of the K selected columns to the corresponding source line control circuits.

In one embodiment, the decode ratio (N/K) of decoder 125 is 8 to 1, where N is the number of columns in array 102 and K is the number of sense amplifiers/line control circuit pairs. However, this ratio may be of other values in other embodiments (e.g. 1, 4, 16). In one embodiment, K is 64 and N is 512, but these may be of different values in other embodiments. Some embodiments do not include a column decoder where each column includes its own sense amplifier and bit line control circuit/source line control circuit pair.

In one embodiment, memory 100 is located on the same integrated circuit (IC) as the processing circuitry (not shown) that requests the memory accesses. In other embodiments, memory 100 may be located on a separate integrated circuit. In still other embodiments, memory 100 may have other configurations. Also, in one embodiment, any OTP memory cells can be located outside of an array configuration, and, although area inefficient, may even be scattered around the IC.

The cells of array 102 can be utilized as reprogrammable MRAM cells where a data state can be changed multiple times over the life of array 102 or OTP cells where a data state can be permanently programmed in the cell. In the illustrated embodiment, all cells of array 102 are utilized as OTP cells, but the structure of the MTJs in an OTP cell is the same as they would be in a reprogrammable MRAM cell.

Figure 3:
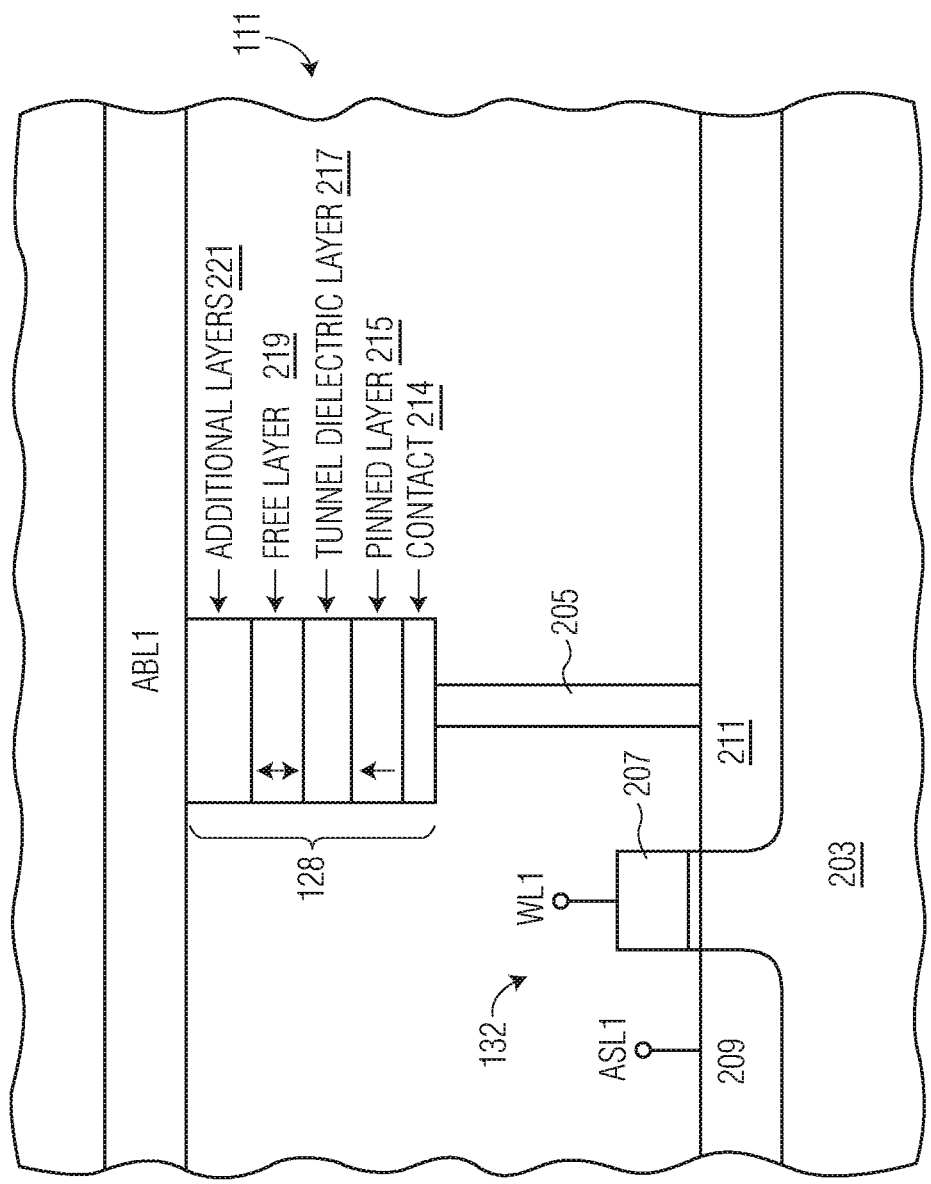
FIG. 3 is a side view of a MRAM cell of FIG. 1 according to one embodiment of the present invention.

FIG. 3 is a side view of an MRAM cell, which can represent any of the OTP cells of array 102 of FIG. 2, according to one embodiment of the present invention. In the embodiment shown, an access transistor 132 of cell 111 is a complementary metal-oxide-semiconductor (CMOS) transistor with a source region 209 and drain region 211 located in a semiconductor substrate 203 of an integrated circuit. Source region 209 is connected to array source line ASL1. Drain region 211 is connected to magnetic tunnel junction (MTJ) 128 by via 205 which is located in one or more interconnect layers of the integrated circuit of the MRAM. The gate 207 of transistor 132 is connected to a word line WL1.

In the embodiment shown, MTJ 128 includes a conductive contact layer 214, a pinned magnetic layer 215, a tunnel dielectric layer 217, and a free magnetic layer 219. In the embodiment shown, MTJ 128 also includes additional layers 221 that include conductive layers. In one embodiment, pinned magnetic layer 215 and free magnetic layer 219 are made of ferromagnetic materials such as cobalt iron boron (CoFeB) and tunnel dielectric layer is made of a dielectric material such as magnesium oxide (MgO). However, these layers may be made of other materials in other embodiments. Also, in other embodiments, an MRAM cell may have other configurations.

The magnetization direction of the pinned layer 215 is fixed. The magnetization direction of free layer 219 can be programmed to be in a parallel direction or an anti-parallel direction to the magnetization direction of pinned layer 215 in order to place the cell 111 into a high resistive state (HRS) or a low resistive state (LRS). When the magnetization direction of free layer 219 is in an anti-parallel direction, the resistance of the MTJ is at a relatively high value, corresponding to the HRS. When the magnetization direction of free layer 219 is in a parallel direction, the resistance of the MTJ is of a relatively lower value, corresponding to the LRS. If cell 111 were utilized as a reprogrammable MRAM cell, the HRS corresponds to storing 1 in the memory cell, and the LRS to storing a 0. A sense amplifier coupled to both the array bit line of the cell and to a reference resistance that is in between the high resistive value and the low resistive value could determine, during a read of the reprogrammable cell, whether a one (1) value (e.g. HRS, corresponding to LCS) or a zero (0) value (e.g. LRS, corresponding to HCS) is stored in the MTJ. Alternatively, the HRS (and thus the LCS) may instead correspond to a zero value and the LRS (and thus HCS) to a one value, however, for the embodiments discussed herein, it is assume that the HRS (and thus LCS) corresponds to the one value.

During a write operation to a reprogrammable MRAM cell, the magnetization direction of free layer 219 can be set by applying a voltage differential of sufficient magnitude across the MTJ to generate the desired current density for setting the magnetization direction of free layer 219. In one embodiment, the magnetization direction of free layer 219 can be set in one direction by applying a higher voltage (VH) to the array bit line (ABL1) and a lower voltage (Gnd) to the source line (ASL1) while the select transistor is conductive, and can similarly be set in the other direction by applying the lower voltage (Gnd) to the array bit line and the higher voltage (VH) to the array source line while the select transistor is conductive. That is, current in a first direction through the MTJ programs the MTJ to a first logic state, and current in a second direction, opposite the first direction, programs the MTJ to a second logic state. In this manner, a reprogrammable MRAM cell can be programmed any number of times to the HRS or LRS, to store a 1 or a 0.

In one embodiment, layers 214, 215, 217, 219, and 221 have a circular disk configuration where the width shown in FIG. 3 is the diameter of the circle. The greater the surface area of the circle, the higher the voltage differential needed to switch the resistive state of the cell. In one embodiment, the voltage differential between VH and ground is in the range of 1-2 Volts but may be of other values in other embodiments.

While a reprogrammable MRAM cell can be in the HRS or the LRS, an OTP MRAM cell (or the MTJ within the OTP MRAM cell) can either be in a permanently blown state or in a non-blown state. Assuming cell 111 is an OTP cell, during a write operation, a sufficiently higher voltage differential can be applied between the array bit line and array source line when select transistor 132 is conductive to permanently break down the resistance of tunnel dielectric layer 217. In this manner, MTJ 128 results in having a relatively low resistance value (and thus a relatively high conductivity value) as compared to the resistance value (or conductivity value, respectively) of a non-blown cell (whether in the HRS or the LRS) where the tunnel dielectric layer is not broken down. As used herein, a cell whose tunnel dielectric has been permanently broken down is referred to as a blown cell and is thus in a permanently blown state. In one embodiment, a blown cell corresponds to permanently storing an OTP value of zero (0). In one embodiment, a non-blown cell (i.e. a cell being in the non-blown state), regardless of whether it is in a HRS or a LRS, corresponds to storing a value of one (1). Once a cell has been blown, it cannot be programmed to provide the HRS or the LRS value (i.e. the LCS or the HCS value) regardless of the magnetization direction of free layer 219. Therefore, any write operation to a blown OTP cell does not change the stored value of the cell.

Figure 4:
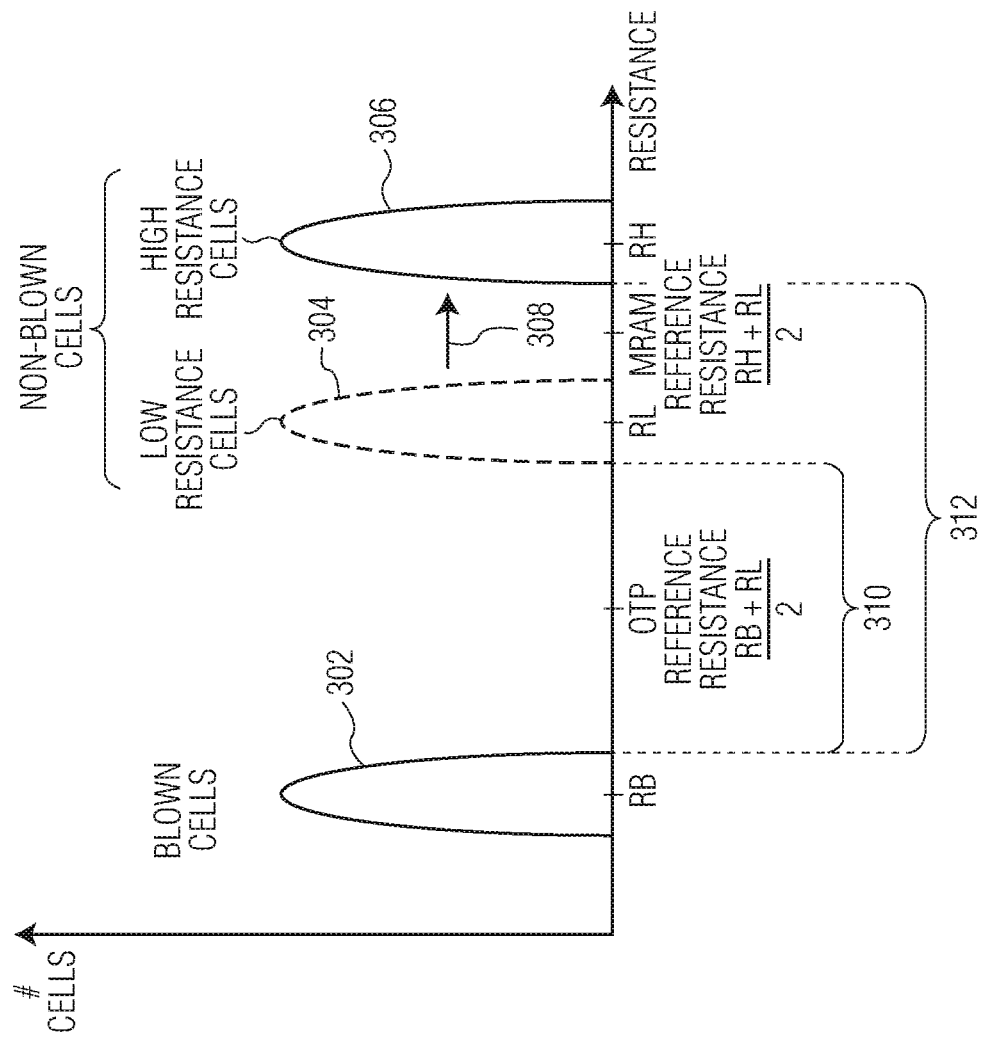
FIG. 4 is a graph showing a distribution of resistances of cells of an MRAM array according to one embodiment of the present invention.

FIG. 4 is a graph showing a distribution of resistances of cells of an MRAM array according to one embodiment of the present invention. In FIG. 4, the resistance values are on the X axis and the number of cells having a particular resistance are on the Y axis. FIG. 4 shows the resistance distribution for cells of an MRAM array that are blown and those that are not blown (note that FIG. 4 is analogous to FIG. 1A). The cells that are not blown are either in a low resistance state or a high resistance state depending upon, in one embodiment, whether the magnetization direction of the free layer of its MTJ is in a parallel or anti-parallel direction with the magnetization of the fixed layer. In the embodiment shown, the blown cells have a resistance distribution 302 centered on the resistive value RB. The low resistance state cells have a resistance distribution 304 centered on RL, and the high resistance state cells have a resistance distribution 306 centered on resistance RH. The OTP reference resistance can be centered half way between RB and RL. The reprogrammable MRAM reference resistance can be centered half way between RL and RH.

Therefore, if the cells of the MRAM array were reprogrammable MRAM cells, then, during a read operation, sense amplifiers would determine whether the resistance of a particular cell is higher or lower than the reprogrammable MRAM reference resistance. However, the cells of MRAM array 102 are OTP cells, in which, during a read operation, cells with a resistance less than the OTP reference resistance correspond to blown cells and provide an read output value of 0 while cells with a resistance greater than the OTP reference resistance correspond to non-blown cells (which can be in either the HRS or LRS) and provide a read output value of 1. In this case, the sense amplifiers of read circuitry 104 may be provided with a voltage reference which corresponds to the OTP reference resistance.

In this example, the read window of an OTP cell is provided by window 310, which is the difference between distribution 302 and distribution resistance 304 (the lower resistance cells of the non-blown cells). The OTP reference resistance should therefore be centered within window 310, such as half way between RB and RL (e.g. (RB+RL)/2). However, if it were known that all non-blown cells in an MRAM array were in the HRS (rather than being in either the LRS or HRS), the distribution of non-blown cells would be represented just by distribution 306. In this case, the read window of an OTP cell is expanded to the difference between distribution 302 and distribution 306, represented by window 312. Window 312 being greater than window 310 allows for a less precise reference generator during reads of the OTP MRAM memory. Even with a less precise reference, there is a larger margin (between the OTP reference and distribution 306) in which to determine whether or not a cell has a larger resistance than the OTP reference resistance.

Therefore, in one embodiment, as part of any read operation from array 102, a write of "1" to all cells being read (corresponding to programming these cells to the HRS) is performed prior to sensing the cells to complete the read operation. In doing so, for the address location being read, distribution 304 shifts (as indicated by arrow 308) into distribution 306 in which all non-blown cells being read fall within distribution 306. By performing a write as part of every read operation to ensure non-blown cells are in the HRS, for the read data stored at the access address, a distribution of LRS cells (e.g. 304) would no longer be present, only a distribution of HRS cells (e.g. 306). This results in the wider read window 312.

Figure 5:
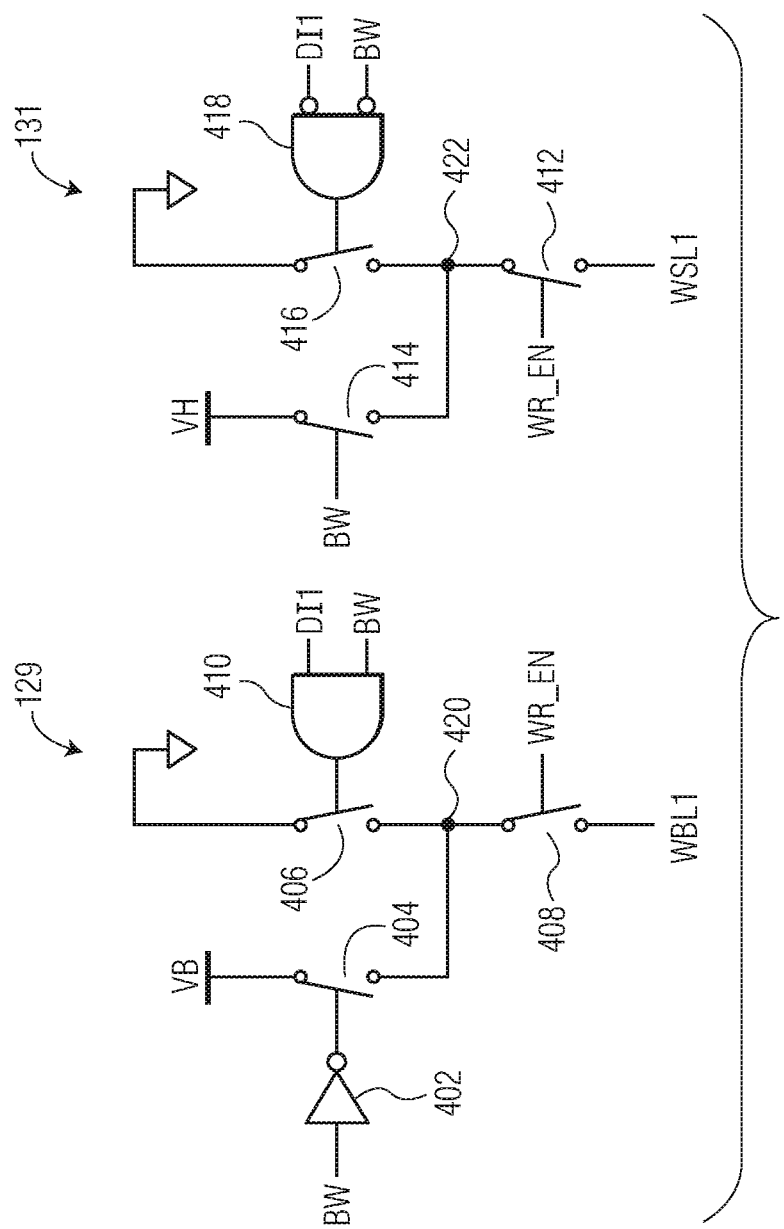
FIG. 5 is a diagram of a bit line control circuit and a source line control circuit of the MRAM of FIG. 2 according to one embodiment of the present invention.

FIG. 5 illustrates example circuitry for implementing the bit line and source line control circuits of FIG. 2. FIG. 5 illustrates bit line control circuit 129 and source line control circuit 131 in accordance with one embodiment of the present invention. Each of bit line control circuit 129 and source line control circuit 131 receives a corresponding data bit of the write data (e.g. DI1), a blind write indicator (BW), and a write enable signal (WR_EN). Bit line control circuit 129 includes inverter 402, AND gate 410, and switches 404, 406, and 408. Source line control circuit 131 includes an AND gate 418 and switches 414, 416, and 412. As used herein, each switch receives a control signal, which when asserted, indicates the switch is on or closed and thus in a conductive state, and when negated, indicated the switch is off or open and thus in a non-conductive state. The switches herein can be implemented with any type of switching circuitry, such as a transistor or combination of transistors. Switch 408 is coupled between WBL1 and a circuit node 420 of bit line control circuit 129, and switch 412 is coupled between WSL1 and a circuit node 422 of source line control circuit 131. Each of switches 408 and 412 receive WR_EN as a control signal such that when WR_EN is asserted, switches 408 and 412 are on or closed to connect WBL1 to circuit node 420 and WSL1 to circuit node 422.

Switch 404 is coupled between a first voltage supply terminal and circuit node 420, and switch 406 is coupled between a second voltage supply terminal and circuit node 420. The first voltage supply terminal provides a voltage, VB, which is greater than a voltage, GND, provided by the second voltage supply terminal. Note that for simplicity, each of the first and second voltage supply terminals may be referred to as VB and GND, respectively.

Switch 404 receives an output of inverter 402 as a control signal. An input of inverter 402 is coupled to receive BW, which, when asserted, indicates a blind write is being performed and when negated, indicates a blind write is not being performed. Therefore, switch 404 is controlled by BW in which switch 404 is on, providing VB to node 420, when BW is negated. Switch 404 is off and decouples VB from node 420 when BW is asserted. Switch 406 receives an output of AND gate 410 as a control signal. A first input of AND gate 410 is coupled to receive DI1 and a second input is coupled to receive BW. Therefore, when both DI1 and BW are asserted to a logic level one, switch 406 is on providing GND to circuit node 420. When either DI1 or BW are negated to a logic level zero, switch 406 is open and decouples GND from circuit node 420.

Switch 414 is coupled between a third voltage supply terminal and circuit node 422, and switch 416 is coupled between GND and circuit node 422. The third voltage supply terminal provides a voltage, VH, which is greater than GND but less than VB. Note that for simplicity, the third voltage supply terminal may be referred to as VH.

Switch 414 receives BW as a control signal. When BW is asserted, switch 414 is on, providing VH to circuit node 422, and when BW is negated, switch 414 is off, decoupling VH from circuit node 422. Switch 416 receives an output of AND gate 418 as a control signal. A first input of AND gate 418 is coupled to receive an inverse of DI1 (as indicated by the bubble at the first input) and a second input is coupled to receive an inverse of BW (as indicated by the bubble at the second input). Therefore, when both DI1 and BW are negated to a logic level zero, switch 416 is on providing GND to circuit node 422. When either DI1 or BW are asserted to a logic level one, switch 416 is opened and decouples GND from circuit node 422.

In operation, each of circuits 129 and 131 provide the appropriate write voltage to WBL1 and WSL1 during a write (when WR_EN is asserted). During the write, WBL1 is connected to either VB or GND and WSL1 is connected to either VH or GND, depending on the values of BW and DI1. During an OTP write (BW=0) in which the MTJ connected to WBL1 and WSL1 is to be blown, VB is provided to WBL1 while WSL1 is at GND. VB should provide a voltage level such that the differential between VB and GND is sufficient to blow the MTJ. During a blind write (BW=1), VH is provided to WSL1 while WBL1 is at GND. In this case, the direction of the current through the MTJ connected to WBL1 and WSL1 sets the MTJ to the HRS, but should not blow the MTJ. Note that a blind write is also characterized as a non-OTP write.

Each of bit line control circuits and source line control circuits of write circuitry 103 are implemented in the same way. In one embodiment, they are all implemented as illustrated in FIG. 5. In other embodiments, note that the logic provided by the circuitry and logic gates of FIG. 5 can be implemented with different circuitry, including different circuit implementations. In another embodiment, in which memory 100 also includes reprogrammable MRAM cells, the bit line and source line control circuits may need further circuitry in order to implement regular writes to the reprogrammable MRAM cells to direct current through the MTJs as needed to write non-OTP ones or zeros to these MRAM cells.

Note that in alternate embodiments, in which the memory is a different type of memory, such as an ReRAM, PCM, or FeRAM, the bit line control circuits and source line control circuits may be implemented differently, as needed, to apply the appropriate voltage over the storage elements to blow the storage elements or to program them to the desired LCS or HCS. In alternate embodiments, each bit line control circuit and source line control circuit would also receive the appropriate voltage values, similar to VB, VH, and GND, as needed for the OTP writes or non-OTP writes.

Figure 6:
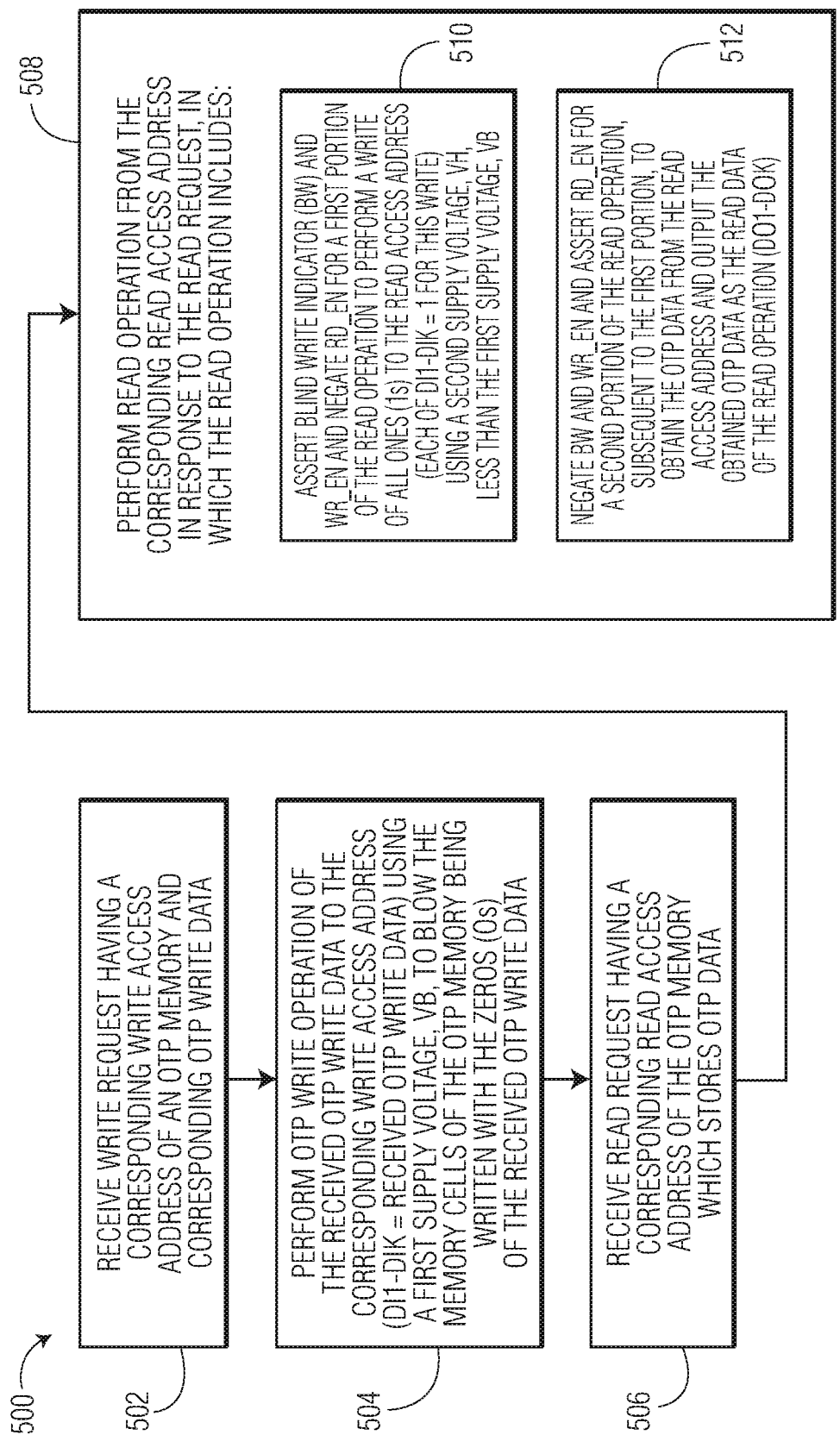
FIG. 6 is a flow diagram for writing to an MRAM and reading from an MRAM according to one embodiment of the present invention.

Operation of memory 100 with respect to reads and writes will be described further in combination with FIG. 5 and FIG. 6. FIG. 6 illustrates, in flow diagram form, a method 500 for per performing a write operation and a read operation to memory 100 of FIG. 2. Method 500 begins by receiving a write request (in block 502) in which the write request has a corresponding write access address (e.g. ADDR) of an OTP memory (e.g. memory 100) and corresponding OTP write data (e.g. DATA). In this case, R/W indicator would be negated to zero to indicate that the request is a write request.

In block 504, an OTP write operation of the received write data is performed to the corresponding write access address. In performing the OTP write operation, a first supply voltage, VB, is used to blow the memory cells being written with the 0s of the received OTP write data. In the illustrated example of memory 100 in FIG. 2, control circuit 127 receives ADDR, R/W, and DATA. Control circuit 127 provides a portion of the address to row decoder 124 to activate the word line corresponding to the memory cells selected by the access address. In one embodiment, a first word line voltage, which may be greater than the voltage applied to the word line to typically write a reprogrammable MRAM cell, is applied to the word line to activate the word line. Control circuit 127 also provides a portion of the address to column decoder 125 which couples the bit lines and source lines of the selected memory cells to WBL1-WBLK and WSL1-WSLK, respectively. Control circuit 127 provides the K-bit DATA as the data input (DI) to the bit line and source line control circuits. Therefore, DI1-DIK is provided to each of WBL1-WBLK, respectively, and to each of WSL1-WSLK, respectively.

For the write operation of block 504, control circuit 127 asserts WR_EN since a write operation is occurring (as indicated by the R/W indicator). Control circuit 127 also negates BW to zero since an OTP write operation is occurring rather than a blind write. For programming OTP write data into OTP memory 100, only writes of 0s are performed in which the memory cells receiving the 0s are blown. The 1s in the programmed OTP data simply correspond to cells which are not blown. Therefore, during the write of OTP data, the cells receiving 0s of the write data are blown and nothing is done to the cells receiving 1s of the write data.

Referring to FIG. 5 as an example for this write, if DI1 is a zero, then the corresponding selected MTJ should be blown. With BW=0 and WR_EN=1, switches 408, 412, 404, and 416 are all on and switches 406 and 414 are off. Therefore, for any bit of the write data which is a 0, VB is provided to the bit line (WBL1) and the source line (WSL1) is grounded, resulting in a voltage differential over the selected MTJ which blows the MTJ. However, if DI1 were instead a one, switches 408, 412, and 404 are on, but switches 406, 414 and 416 are off. Therefore, for any bit of the write data which is a 1, VB is provided to the bit line but the source line is left floating, which inhibits any current through the selected MTJ, and the selected MTJ still remains non-blown.

Blocks 502 and 504 can be used to perform any number of OTP writes to memory 100. For example, these OTP writes can be performed during manufacture, before or after solder reflow of an integrated circuit containing memory 100. Since no current is provided during OTP writes of 1 to the selected cell, the resistance of the cell is not typically known. That is, it may be in a HRS or a LRS. Anytime after programming OTP memory 100 with OTP data, OTP memory 100 can be read.

In block 506, a read request is received by the OTP memory to read the OTP data stored at the corresponding read access address. In this case, control circuit 127 receives the read access address, ADDR, and the R/W indicator would be asserted to 1 to indicate a read access request. As with a write operation, control circuit 127 provides a portion of the address to row decoder 124 to activate the word line corresponding to the memory cells selected by the access address. In one embodiment, a second word line voltage, which may be lower than the first word line voltage (applied to the word line during an OTP write operation), is applied to the word line to activate the word line. For the read operation, control circuit 127 also provides a portion of the address to column decoder 125 which couples the bit lines of the selected memory cells to the read bit lines (RBL1-RBLK), respectively, and couples the bit lines and source lines of the selected memory cells to WBL1-WBLK and WSL1-WSLK, respectively. (Although not illustrated, in an alternate embodiment, column decoder 125 may couple the source lines of the selected memory cells to read source lines.) In response to the read request, a read operation (block 508) is performed. The read operation (block 508) includes both a blind write portion (block 510) and a subsequent read portion (512), which are controlled by control circuit 127. In one embodiment, the write and read portions of the read operation are controlled by read state machine (SM) 130 within control circuit 127.

First, in block 510, control circuit 127 (e.g. read SM 130) asserts both BW and WR_EN to a logic level 1 and negates RD_EN to a logic level 0 for a first portion of the read operation in order to perform a write of all 1s to the read access address, using VH. Control circuit 127 driving BW to a logic level one forces a write of all 1s (in which DI1-D1K are provided as all 1s to the bit line and source line control circuits of write circuitry 103). Referring to FIG. 4, with BW=1, WR_EN=1, and DI1=1, switches 408, 412, 406, and 414 are on, and switches 404 and 416 are off. This results in VH being provided to all the write source lines WSL1-WSLK, and all write bit lines WBL1-WBLK being grounded. In this manner, all MTJs in the selected cell (selected by the access address of the read request) are programmed to the HRS. This write is characterized as a blind write because a write of 1 is performed on the MTJs of all the cells selected by the access address of the read request, regardless of whether a particular MTJ has previously been blown or not (i.e. regardless of whether a particular cell already stores an OTP zero or not.) Note that a blind write of 0 is inhibited because control circuit 127 forces all write data to a 1 for the blind write operation. Note also that during the blind write portion of the read operation, RD_EN is negated such that the sense amplifiers SA1-SAK are not yet enabled.

Secondly, in block 512 which occurs after completion of the blind write in block 510, BW and WR_EN are negated to 0 and RD_EN is asserted to 1 for a second portion of the read operation. With RD_EN asserted, sense amplifiers SA1-SAK sense the selected cells by comparing the voltage on each selected bit line to a reference voltage, REF, received from reference circuit 141 to obtain the OTP data from the read access address and output the obtained OTP data as the read data output of the read operation (DO1-DOK). In an alternate embodiment, REF may correspond to a reference current instead in which the sense amplifiers compare the current on each selected bit line with the reference current. Note that REF is indicative of the reference resistance, as was discussed with respect to FIG. 4.

Since a blind write to at least the memory cells corresponding to the read access address guarantees that any non-blown memory cells are in the HRS prior to sensing the cells, reference circuit 141 is capable of providing a less precise reference voltage or current, due to the wider read window as was described above in reference to the graph of FIG. 4. This allows for smaller reference or bias generation circuits and reduced standby currents. Also, since a blind write is performed, each of the non-blown memory cells being read is set to the HRS without knowing or needing to know the values of the originally stored data.

In addition to increasing the read window, blind writes may also be used for tampering detection. For example, a normal read can first be performed and the read data stored somewhere, followed by a blind write and a subsequent read (similar to the read from OTP cells described herein). The read data from the subsequent read can then be compared to the stored read data from the prior normal read to determine if a tampering condition has occurred with respect to the selected address. Note that this method may require the use of more precise references, but that may be justified in order to achieve improved tampering detection.

Therefore, by now it can be understood how the read window of an OTP memory, such as an OTP MRAM memory, can be widened, allowing for generation of an imprecise reference for read operations. In one embodiment, this is achieved by performing a blind write in the first portion of every read operation. The blind write programs every memory cell selected by the access address corresponding to the read operation, regardless of the conductivity of the selected memory cells. With the blind write, those non-blown storage elements of the selected cells are set to a predetermined one of the LCS or HCS while the blown storage elements remain unaffected. For example, for an OTP MRAM memory, the blind write writes a 1 to every selected MRAM cell, regardless of the resistances of the selected MRAM cells, such that those non-blown MTJs of the selected cells are set to the HRS while the blown MTJs remain unaffected. After completion of the blind write, in the subsequent second portion of the read operation, the read operation is completed by sensing the selected cells and providing the sensed data from the selected cells as the read OTP data.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

The following are some embodiments of the present invention.

In one embodiment, a memory includes a plurality of one-time programmable (OTP) memory cells, and control circuitry. In the memory, each OTP memory cell includes a corresponding storage element, wherein the corresponding storage element is capable of being in a permanently blown state or non-blown state, in which, in the non-blown state, the corresponding storage element is capable of being in a low conductive state (LCS) or a high conductive state (HCS), the LCS corresponding to a lower conductivity than the HCS. The control circuitry is configured to, in response to a received read request having a corresponding access address which selects a set of OTP memory cells, direct write circuitry to apply a voltage differential across the corresponding storage element of each selected OTP memory cell sufficient to set the corresponding storage element to a predetermined one of the LCS or HCS, and after the write circuitry applies the voltage differential across the corresponding storage element of each selected OTP memory cell, direct read circuitry to read the selected OTP memory cells to output read data stored in the selected OTP memory cells. In one aspect of the embodiment, in response to the write circuitry applying the voltage differential across the corresponding storage element of each selected OTP memory cell, those cells of the selected OTP memory cells which are in the non-blown state are set to the predetermined one of the LCS or HCS. In a further aspect, in response to the write circuitry applying the voltage differential across the corresponding storage element of each selected OTP memory cells, those cells of the selected OTP memory cells which are in the blown state do not change state. In another aspect of the embodiment, in response to reading the selected OTP memory cells to output the read data, those cells of the select OTP memory cells which are in the non-blown state are each provided as a first bit value and those cells of the selected OTP memory cells which are in the blown state are each provided as a second bit value, opposite the first bit value. In yet another aspect, the memory is further characterized as a magneto-resistive random access memory (MRAM) and each corresponding storage element includes a magnetic tunnel junction (MTJ), wherein each MTJ is capable of being in the permanently blown state or the non-blown state, in which, in the non-blown state, the corresponding storage element is capable of being in a high resistive state (HRS), corresponding to the LCS, or a low resistive state (LRS), corresponding to the HCS, the HRS having a higher resistance than the LRS, and the predetermined one of the LCS or HCS is the LCS. In another aspect, the memory is further characterized as a memory type selected from a group consisting of an MRAM, a resistive random access memory (ReRAM), a phase change memory (PCM), and a ferroelectric random access memory (FeRAM). In another aspect, in response to the write circuitry applying the voltage differential across the corresponding storage element of each selected OTP memory cell, each selected OTP memory cell is in either the blown state or in the predetermined one of the LCS or HCS. In a further aspect, the write circuitry is configured to apply the voltage differential across the corresponding storage element of each selected OTP memory cell sufficient to set the corresponding storage element to the predetermined one of the LCS or HCS regardless of a state of the corresponding storage element prior to the applying the voltage differential. In another aspect, the read circuitry comprises a plurality of sense amplifiers, wherein each sense amplifier is coupled to a corresponding memory cell of the selected OTP memory cells and, during the read, compares an indication of a conductivity of each OTP memory cell to an indication of a reference conductivity. In a further aspect, the reference conductivity corresponds to a conductivity between a conductivity of a blown storage element and the predetermined one of the LCS or HCS. In yet another aspect, the control circuitry is further configured to, in response to a received write request having corresponding write data and a corresponding access address which selects a second set of OTP memory cells, apply a voltage differential across the corresponding storage element of each selected OTP memory cell in the second set of OTP memory cells sufficient to permanently blow the corresponding storage element when a corresponding bit of the write data has a first bit value. In a further aspect, the control circuitry is further configured to, in response to the received write request, apply no voltage differential across the corresponding storage element of each selected OTP memory cell in the second set of OTP memory cells when the corresponding bit of the write data has a second bit value.

In another embodiment, in an MRAM array including one-time programmable (OTP) MRAM cells, each OTP MRAM cell of the MRAM array including a corresponding Magnetic Tunnel Junction (MTJ) coupled to a corresponding source line of the MRAM array via a corresponding select transistor and coupled to a corresponding bit line of the array, wherein the corresponding MTJ is capable of being in a permanently blown state or non-blown state, in which, in the non-blown state, the corresponding MTJ is capable of being in a high resistive state (HRS) or a low resistive state (LRS), the HRS corresponding to a higher resistance than the LRS, a method includes receiving a read request having a corresponding read access address, wherein the corresponding read access address addresses a first plurality of OTP MRAM cells, and in response to the read request, performing a read operation from the corresponding read access address. Performing the read operation includes performing a write by applying a first voltage to the corresponding source lines coupled to the first plurality of OTP MRAM cells and a second voltage to the corresponding bit lines coupled to the first plurality of OTP MRAM cells, wherein the first voltage is greater than the second voltage and is sufficient to set each corresponding MTJ of the first plurality of OTP MRAM cells to the HRS, and after performing the write, reading the first plurality of OTP MRAM cells to output read data stored in the first plurality of OTP MRAM cells. In one aspect of the another embodiment, the method further includes receiving a write request to program write data to a corresponding write access address, wherein the corresponding write access address addresses a second plurality of OTP MRAM cells, and each bit of the write data corresponding to an OTP MRAM cell of the second plurality of OTP MRAM cells, and, in response to the write request, applying a third voltage to the corresponding bit lines coupled to the second plurality of OTP MRAM cells whose corresponding bit of the write data has a first bit value, wherein the third voltage is greater than the first and second voltages so as to permanently blow a tunnel dielectric layer of the corresponding MTJ. In a further aspect, the method further includes, in response to the write request, allowing the corresponding source lines coupled to the second plurality of OTP MRAM cells whose corresponding bit of the write data has a second value, different from the first value, to float. In yet a further aspect, in response to the write request, applying the second voltage to the corresponding source lines coupled to the second plurality of OTP MRAM cells. In an other aspect of the another embodiment, performing the write during the read operation is performed such that the first voltage is applied to the corresponding source lines coupled to the first plurality of OTP MRAM cells and the second voltage to the corresponding bit lines coupled to the first plurality of OTP MRAM cells regardless of a state of the corresponding MTJ prior to the write. In another aspect, after performing the write during the read operation, each OTP MRAM cell in the first plurality of OTP MRAM cells is in either the blown state or the HRS.

In yet another embodiment, in a memory array including one-time programmable (OTP) memory cells, each OTP memory cell of the memory array including a corresponding storage element, wherein the corresponding storage element is capable of being in a permanently blown state or non-blown state, in which, in the non-blown state, the corresponding storage element is capable of being in a low conductive state (LCS) or a high conductive state (HCS), the LCS corresponding to a lower conductivity than the HCS, a method includes receiving a read request having a corresponding read access address, wherein the corresponding read access address addresses a first plurality of OTP memory cells, and, in response to the read request, performing a read operation from the corresponding read access address. Performing the read operation includes performing a write by applying a first voltage differential over each corresponding storage element of the first plurality of OTP memory cells, wherein the first voltage differential is sufficient to set each corresponding storage element of the first plurality of OTP memory cells to a predetermined one of the LCS or HCS, and, after performing the write, reading the first plurality of OTP memory cells to output read data stored in the first plurality of OTP memory cells. In one aspect of the yet another embodiment, the method further includes receiving a write request to program write data to a corresponding write access address, wherein the corresponding write access address addresses a second plurality of OTP memory cells, and each bit of the write data corresponding to an OTP memory cell of the second plurality of OTP memory cells, and, in response to the write request, applying a second voltage differential over each corresponding storage element of the second plurality of OTP memory cells whose corresponding bit of the write data has a first bit value, wherein the second voltage differential is greater than the first voltage differential so as to permanently blow the corresponding storage element.

What is claimed is:

1. A memory comprising:
   a plurality of one-time programmable (OTP) memory cells, wherein each OTP memory cell includes a corresponding storage element, wherein the corresponding storage element is capable of being in a permanently blown state or non-blown state, in which, in the non-blown state, the corresponding storage element is capable of being in a low conductive state (LCS) or a high conductive state (HCS), the LCS corresponding to a lower conductivity than the HCS; and
   control circuitry configured to, in response to a received read request having a corresponding access address which selects a set of OTP memory cells:
     direct write circuitry to apply a voltage differential across the corresponding storage element of each selected OTP memory cell sufficient to set the corresponding storage element to a predetermined one of the LCS or the HCS, and
     after the write circuitry applies the voltage differential across the corresponding storage element of each selected OTP memory cell, direct read circuitry to read the selected OTP memory cells to output read data stored in the selected OTP memory cells.

2. The memory of claim 1, wherein, in response to the write circuitry applying the voltage differential across the corresponding storage element of each selected OTP memory cell, those cells of the selected OTP memory cells which are in the non-blown state are set to the predetermined one of the LCS or the HCS.

3. The memory of claim 2, wherein, in response to the write circuitry applying the voltage differential across the corresponding storage element of each selected OTP memory cell, those cells of the selected OTP memory cells which are in the blown state do not change state.

4. The memory of claim 1, wherein, in response to reading the selected OTP memory cells to output the read data, those cells of the select OTP memory cells which are in the non-blown state are each provided as a first bit value and those cells of the selected OTP memory cells which are in the blown state are each provided as a second bit value, opposite the first bit value.

5. The memory of claim 1, wherein the memory is further characterized as a magneto-resistive random access memory (MRAM) and each corresponding storage element comprises a magnetic tunnel junction (MTJ), wherein each MTJ is capable of being in the permanently blown state or the non-blown state, in which, in the non-blown state, the corresponding storage element is capable of being in a high resistive state (HRS), corresponding to the LCS, or a low resistive state (LRS), corresponding to the HCS, the HRS having a higher resistance than the LRS, and the predetermined one of the LCS or the HCS is the LCS.

6. The memory of claim 1, wherein the memory is further characterized as a memory type selected from a group consisting of an MRAM, a resistive random access memory (ReRAM), a phase change memory (PCM), and a ferroelectric random access memory (FeRAM).

7. The memory of claim 1, wherein in response to the write circuitry applying the voltage differential across the corresponding storage element of each selected OTP memory cell, each selected OTP memory cell is in either the blown state or in the predetermined one of the LCS or the HCS.

8. The memory of claim 7, wherein the write circuitry is configured to apply the voltage differential across the corresponding storage element of each selected OTP memory cell sufficient to set the corresponding storage element to the predetermined one of the LCS or the HCS regardless of a state of the corresponding storage element prior to the applying the voltage differential.

9. The memory of claim 1, wherein the read circuitry comprises a plurality of sense amplifiers, wherein each sense amplifier is coupled to a corresponding memory cell of the selected OTP memory cells and, during the read, compares an indication of a conductivity of each OTP memory cell to an indication of a reference conductivity.

10. The memory of claim 9, wherein the reference conductivity corresponds to a conductivity between a conductivity of a blown storage element and the predetermined one of the LCS or the HCS.

11. The memory of claim 1, wherein the control circuitry is further configured to, in response to a received write request having corresponding write data and a corresponding access address which selects a second set of OTP memory cells:
apply a voltage differential across the corresponding storage element of each selected OTP memory cell in the second set of OTP memory cells sufficient to permanently blow the corresponding storage element when a corresponding bit of the write data has a first bit value.

12. The memory of claim 11, wherein the control circuitry is further configured to, in response to the received write request:
apply no voltage differential across the corresponding storage element of each selected OTP memory cell in the second set of OTP memory cells when the corresponding bit of the write data has a second bit value.

13. In an MRAM array including one-time programmable (OTP) MRAM cells, each OTP MRAM cell of the MRAM array including a corresponding Magnetic Tunnel Junction (MTJ) coupled to a corresponding source line of the MRAM array via a corresponding select transistor and coupled to a corresponding bit line of the array, wherein the corresponding MTJ is capable of being in a permanently blown state or non-blown state, in which, in the non-blown state, the corresponding MTJ is capable of being in a high resistive state (HRS) or a low resistive state (LRS), the HRS corresponding to a higher resistance than the LRS, a method comprises:
receiving a read request having a corresponding read access address, wherein the corresponding read access address addresses a first plurality of OTP MRAM cells; and
in response to the read request, performing a read operation from the corresponding read access address, wherein the performing the read operation includes:
performing a write by applying a first voltage to the corresponding source lines coupled to the first plurality of OTP MRAM cells and a second voltage to the corresponding bit lines coupled to the first plurality of OTP MRAM cells, wherein the first voltage is greater than the second voltage and is sufficient to set each corresponding MTJ of the first plurality of OTP MRAM cells to the HRS, and
after performing the write, reading the first plurality of OTP MRAM cells to output read data stored in the first plurality of OTP MRAM cells.

14. The method of claim 13, further comprising:
receiving a write request to program write data to a corresponding write access address, wherein the corresponding write access address addresses a second plurality of OTP MRAM cells, and each bit of the write data corresponding to an OTP MRAM cell of the second plurality of OTP MRAM cells; and
in response to the write request:
applying a third voltage to the corresponding bit lines coupled to the second plurality of OTP MRAM cells whose corresponding bit of the write data has a first bit value, wherein the third voltage is greater than the first and second voltages so as to permanently blow a tunnel dielectric layer of the corresponding MTJ.

15. The method of claim 14, further comprising:
in response to the write request, allowing the corresponding source lines coupled to the second plurality of OTP MRAM cells whose corresponding bit of the write data has a second value, different from the first value, to float.

16. The method of claim 15, wherein in response to the write request, applying the second voltage to the corresponding source lines coupled to the second plurality of OTP MRAM cells.

17. The method of claim 13, wherein performing the write during the read operation is performed such that the first voltage is applied to the corresponding source lines coupled to the first plurality of OTP MRAM cells and the second voltage to the corresponding bit lines coupled to the first plurality of OTP MRAM cells regardless of a state of the corresponding MTJ prior to the write.

18. The method of claim 13, wherein after performing the write during the read operation, each OTP MRAM cell in the first plurality of OTP MRAM cells is in either the blown state or the HRS.

19. In a memory array including one-time programmable (OTP) memory cells, each OTP memory cell of the memory array including a corresponding storage element, wherein the corresponding storage element is capable of being in a permanently blown state or non-blown state, in which, in the non-blown state, the corresponding storage element is capable of being in a low conductive state (LCS) or a high conductive state (HCS), the LCS corresponding to a lower conductivity than the HCS, a method comprises:
receiving a read request having a corresponding read access address, wherein the corresponding read access address addresses a first plurality of OTP memory cells; and
in response to the read request, performing a read operation from the corresponding read access address, wherein the performing the read operation includes:
performing a write by applying a first voltage differential over each corresponding storage element of the first plurality of OTP memory cells, wherein the first voltage differential is sufficient to set each corresponding storage element of the first plurality of OTP memory cells to a predetermined one of the LCS or the HCS, and
after performing the write, reading the first plurality of OTP memory cells to output read data stored in the first plurality of OTP memory cells.

20. The method of claim 19, further comprising:
receiving a write request to program write data to a corresponding write access address, wherein the corresponding write access address addresses a second plurality of OTP memory cells, and each bit of the write data corresponding to an OTP memory cell of the second plurality of OTP memory cells; and
in response to the write request:
applying a second voltage differential over each corresponding storage element of the second plurality of OTP memory cells whose corresponding bit of the write data has a first bit value, wherein the second voltage differential is greater than the first voltage differential so as to permanently blow the corresponding storage element.

* * * * *